US010115752B2

(12) United States Patent
Azami et al.

(10) Patent No.: US 10,115,752 B2
(45) Date of Patent: Oct. 30, 2018

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Kenji Azami, Kanagawa (JP); Yusuke Otake, Kanagawa (JP); Toshifumi Wakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/541,105

(22) PCT Filed: Jan. 8, 2016

(86) PCT No.: PCT/JP2016/050447
§ 371 (c)(1),
(2) Date: Jun. 30, 2017

(87) PCT Pub. No.: WO2016/117381
PCT Pub. Date: Jul. 28, 2016

(65) Prior Publication Data
US 2017/0358614 A1    Dec. 14, 2017

(30) Foreign Application Priority Data
Jan. 22, 2015    (JP) ................. 2015-010304

(51) Int. Cl.
*H01L 27/146*    (2006.01)
*H04N 5/369*    (2011.01)
(Continued)

(52) U.S. Cl.
CPC .... *H01L 27/14605* (2013.01); *H01L 27/1461* (2013.01); *H01L 27/1463* (2013.01);
(Continued)

(58) Field of Classification Search
CPC ............. H01L 27/14605; H01L 27/156; H01L 27/1463; H01L 27/1461; H01L 27/14621; H01L 27/14689; H04N 5/369; H04N 9/07
(Continued)

(56) References Cited

U.S. PATENT DOCUMENTS

2006/0092299 A1* 5/2006 Suzuki .................. H04N 5/335
348/294
2006/0266921 A1* 11/2006 Kang ................ H01L 27/14621
250/208.1
(Continued)

FOREIGN PATENT DOCUMENTS

JP    2006-120921 A    5/2006
JP    2006-332602 A    12/2006
(Continued)

OTHER PUBLICATIONS

International Search Report and Written Opinion of PCT Application No. PCT/JP2016/050447, dated Mar. 15, 2016, 03 pages of English Translation and 11 pages of ISRWO.

*Primary Examiner* — Fernando L Toledo
*Assistant Examiner* — Adam S Bowen
(74) *Attorney, Agent, or Firm* — Chip Law Group

(57) ABSTRACT

The present technology relates to a solid-state imaging device that can achieve a higher resolution while increasing sensitivity, and an electronic apparatus. In a pixel array unit, pixels are two-dimensionally arranged, and the pixels are formed with a combination of: a first pixel that performs photoelectric conversion on light of a first color component with a first photoelectric conversion unit, and photoelectric conversion on light of a third color component with a second photoelectric conversion unit, the light of the third color component having passed through a first color filter and the first photoelectric conversion unit, the first color filter being designed to pass light of a second color component; a second
(Continued)

pixel that performs photoelectric conversion on light of the first color component with a first photoelectric conversion unit, and photoelectric conversion on light of a fifth color component with a second photoelectric conversion unit, the light of the fifth color component having passed through a second color filter and the first photoelectric conversion unit, the second color filter being designed to pass light of a fourth color component; and a third pixel that performs photoelectric conversion on light of the first color component with a first photoelectric conversion unit, and photoelectric conversion on light of a sixth color component with a second photoelectric conversion unit, the light of the sixth color component having passed through the first photoelectric conversion unit. The first color component and the sixth color component are mixed, to generate white (W).

12 Claims, 10 Drawing Sheets

(51) Int. Cl.
    *H04N 9/07*     (2006.01)
    *H01L 27/15*     (2006.01)

(52) U.S. Cl.
    CPC .. *H01L 27/14621* (2013.01); *H01L 27/14689* (2013.01); *H01L 27/156* (2013.01); *H04N 5/369* (2013.01); *H04N 9/07* (2013.01)

(58) Field of Classification Search
    USPC ......................................................... 257/432
    See application file for complete search history.

(56) References Cited

U.S. PATENT DOCUMENTS

| | | | |
|---|---|---|---|
| 2007/0291144 A1* | 12/2007 | Suzuki | H01L 27/14621 348/272 |
| 2008/0246853 A1* | 10/2008 | Takizawa | H01L 27/14621 348/222.1 |
| 2009/0046185 A1* | 2/2009 | Ota | H04N 5/23232 348/294 |
| 2009/0278048 A1* | 11/2009 | Choe | H01L 27/14647 250/339.05 |
| 2010/0141771 A1* | 6/2010 | Hu | H01L 27/14621 348/164 |
| 2013/0182173 A1* | 7/2013 | Murata | H01L 27/14605 348/349 |
| 2015/0077590 A1* | 3/2015 | Kuriyama | H04N 5/3745 348/231.99 |
| 2015/0372036 A1 | 12/2015 | Suh et al. | |

FOREIGN PATENT DOCUMENTS

| | | |
|---|---|---|
| JP | 2007-311550 A | 11/2007 |
| JP | 2007-336282 A | 12/2007 |
| JP | 2008-258474 A | 10/2008 |
| JP | 2009-027063 A | 2/2009 |
| JP | 2009027063 A * | 2/2009 |
| JP | 2009-049524 A | 3/2009 |
| JP | 2009-272620 A | 11/2009 |
| JP | 2010-532869 A | 10/2010 |
| JP | 2013-145292 A | 7/2013 |
| WO | 2012/169127 A1 | 12/2012 |
| WO | 2013/164915 A1 | 11/2013 |
| WO | 2015/005234 A1 | 1/2015 |

\* cited by examiner

SOLID-STATE IMAGING DEVICE AND ELECTRONIC APPARATUS

CROSS REFERENCE TO RELATED APPLICATIONS

This application is a U.S. National Phase of International Patent Application No. PCT/JP2016/050447 filed on Jan. 8, 2016, which claims priority benefit of Japanese Patent Application No. JP 2015-010304 filed in the Japan Patent Office on Jan. 22, 2015. Each of the above-referenced applications is hereby incorporated herein by reference in its entirety.

TECHNICAL FIELD

The present technology relates to solid-state imaging devices and electronic apparatuses, and more particularly, to a solid-state imaging device designed to be able to achieve a higher resolution while increasing sensitivity, and an electronic apparatus.

BACKGROUND ART

To achieve a higher resolution in a conventional solid-state imaging device such as a complementary metal oxide semiconductor (CMOS) image sensor, the pixels are normally made smaller in size. However, a reduction in the size of the pixels causes degradation of the pixel characteristics and sensitivity. To counter this, there is a suggested technique by which an organic photoelectric conversion film as a component for achieving a higher resolution is stacked on a silicon substrate including photodiodes in a solid-state imaging device (see Patent Document 1, for example).

CITATION LIST

Patent Document

Patent Document 1: Japanese Patent Application Laid-Open No. 2007-311550

SUMMARY OF THE INVENTION

Problems to be Solved by the Invention

In the structure disclosed in Patent Document 1, however, any pixel for increasing sensitivity is not provided, and therefore, it is difficult to achieve a higher resolution while increasing sensitivity.

The present technology has been developed in view of those circumstances, and aims to achieve a higher resolution while increasing sensitivity.

Solutions to Problems

A solid-state imaging device according to a first aspect of the present technology is a solid-state imaging device that includes a pixel array unit in which a plurality of pixels are two-dimensionally arranged, each of the pixels including: a first photoelectric conversion unit that generates a signal charge by absorbing light of a first color component; and a second photoelectric conversion unit that generates a signal charge in accordance with an amount of incident light, the second photoelectric conversion unit being formed with a photodiode. The pixels two-dimensionally arranged in the pixel array unit are formed with a combination of: a first pixel that performs photoelectric conversion on light of the first color component with the first photoelectric conversion unit, and photoelectric conversion on light of a third color component with the second photoelectric conversion unit, the light of the third color component having passed through a first color filter and the first photoelectric conversion unit, the first color filter being configured to pass light of a second color component; a second pixel that performs photoelectric conversion on light of the first color component with the first photoelectric conversion unit, and photoelectric conversion on light of a fifth color component with the second photoelectric conversion unit, the light of the fifth color component having passed through a second color filter and the first photoelectric conversion unit, the second color filter being configured to pass light of a fourth color component; and a third pixel that performs photoelectric conversion on light of the first color component with the first photoelectric conversion unit, and photoelectric conversion on light of a sixth color component with the second photoelectric conversion unit, the light of the sixth color component having passed through the first photoelectric conversion unit. The first color component and the sixth color component are mixed, to generate white (W).

An electronic apparatus according to a second aspect of the present technology is an electronic apparatus that includes a solid-state imaging device including a pixel array unit in which a plurality of pixels are two-dimensionally arranged, each of the pixels including: a first photoelectric conversion unit that generates a signal charge by absorbing light of a first color component; and a second photoelectric conversion unit that generates a signal charge in accordance with an amount of incident light, the second photoelectric conversion unit being formed with a photodiode. The pixels two-dimensionally arranged in the pixel array unit are formed with a combination of: a first pixel that performs photoelectric conversion on light of the first color component with the first photoelectric conversion unit, and photoelectric conversion on light of a third color component with the second photoelectric conversion unit, the light of the third color component having passed through a first color filter and the first photoelectric conversion unit, the first color filter being configured to pass light of a second color component; a second pixel that performs photoelectric conversion on light of the first color component with the first photoelectric conversion unit, and photoelectric conversion on light of a fifth color component with the second photoelectric conversion unit, the light of the fifth color component having passed through a second color filter and the first photoelectric conversion unit, the second color filter being configured to pass light of a fourth color component; and a third pixel that performs photoelectric conversion on light of the first color component with the first photoelectric conversion unit, and photoelectric conversion on light of a sixth color component with the second photoelectric conversion unit, the light of the sixth color component having passed through the first photoelectric conversion unit. The first color component and the sixth color component are mixed, to generate white (W).

According to the first aspect and the second aspect of the present technology, in a pixel array unit, pixels are two-dimensionally arranged, and the pixels are formed with a combination of: a first pixel that performs photoelectric conversion on light of a first color component with a first photoelectric conversion unit, and photoelectric conversion on light of a third color component with a second photoelectric conversion unit, the light of the third color component having passed through a first color filter and the first photoelectric conversion unit, the first color filter being designed to pass light of a second color component; a second pixel that performs photoelectric conversion on light of the first color component with a first photoelectric conversion unit, and photoelectric conversion on light of a fifth color component with a second photoelectric conversion unit, the light of the fifth color component having passed through a second color filter and the first photoelectric conversion unit, the second color filter being designed to pass light of a fourth color component; and a third pixel that performs photoelectric conversion on light of the first color component with a first photoelectric conversion unit, and photoelectric conversion on light of a sixth color component with a second photoelectric conversion unit, the light of the sixth color component having passed through the first photoelectric conversion unit. The first color component and the sixth color component are mixed, to generate white (W).

Effects of the Invention

According to the first aspect and the second aspect of the present technology, it is possible to achieve a higher resolution while increasing sensitivity.

It should be noted that effects of the present technology are not limited to the effect described herein, and may include any of the effects described in the present disclosure.

MODE FOR CARRYING OUT THE INVENTION

The following is a description of embodiments of the present technology, with reference to the drawings. It should be noted that explanation will be made in the following order.

1. Configuration of a Solid-State Imaging Device
2. First Embodiment: Basic Structure 1 (G organic photoelectric conversion film+R and B color filters)
3. Second Embodiment: Basic Structure 2 (G organic photoelectric conversion film+Ye and Cy color filters)
4. Third Embodiment: Structure with Buried Photodiodes
5. Fourth Embodiment: Structure with Divided Transparent Electrodes
6. Fifth Embodiment: Structure with Stacked Semiconductor Substrates
7. Configurations of Camera Modules
8. Configuration of an Electronic Apparatus
9. Examples of Use of a Solid-State Imaging Device 1. Configuration of a Solid-State Imaging Device (Configuration of a Solid-State Imaging Device)

Figure 1:
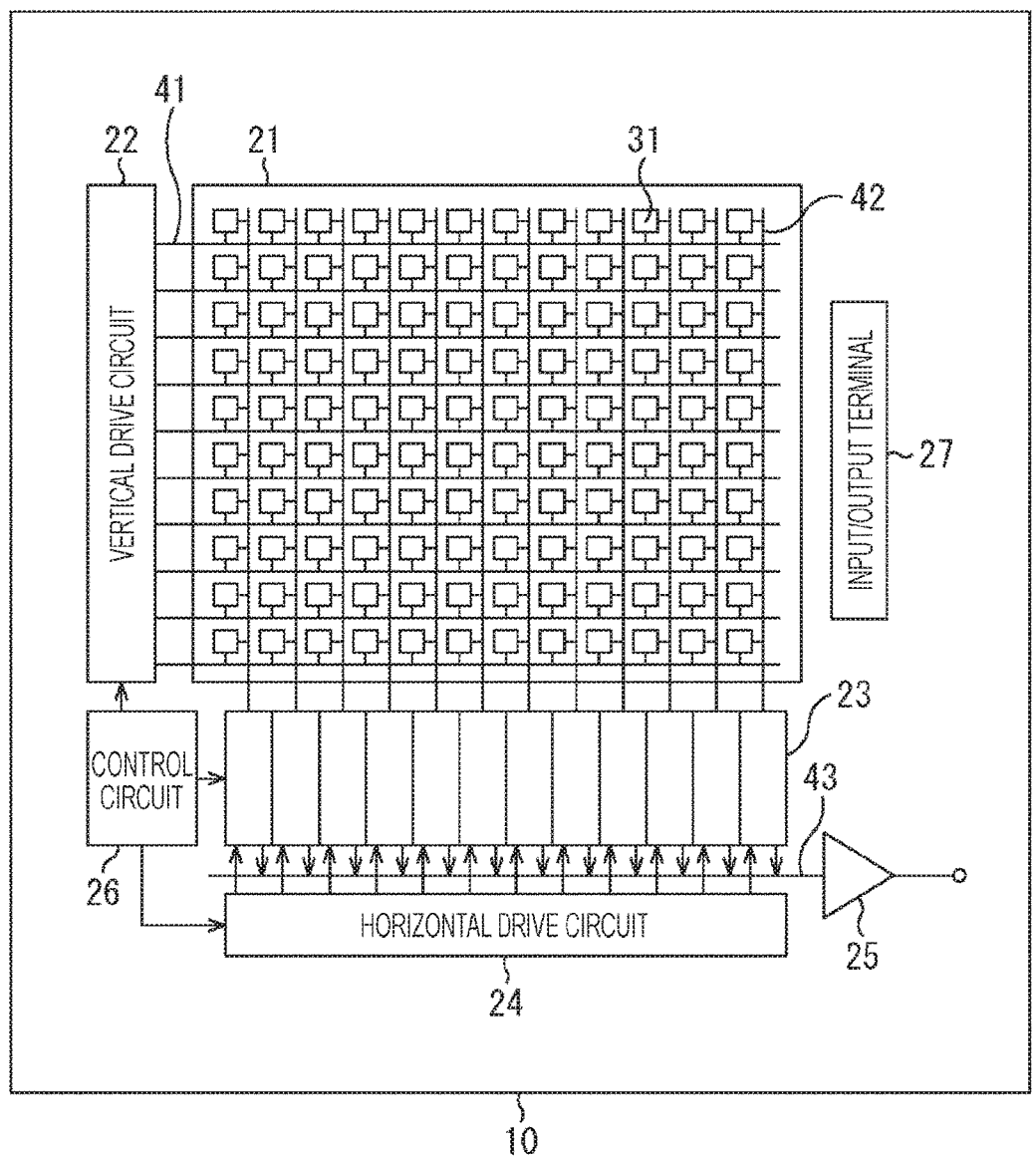
FIG. 1 is a diagram showing an example configuration of a solid-state imaging device.

FIG. 1 is a diagram showing an example configuration of a solid-state imaging device.

The solid-state imaging device 10 shown in FIG. 1 is an image sensor, such as a CMOS image sensor. The solid-state imaging device 10 captures incident light (image light) from the object via an optical lens system (not shown), converts the amount of the incident light gathered on the imaging surface into an electrical signal on a pixel-by-pixel basis, and outputs the electrical signal as a pixel signal.

In FIG. 1, the solid-state imaging device 10 includes a pixel array unit 21, a vertical drive circuit 22, column signal processing circuits 23, a horizontal drive circuit 24, an output circuit 25, a control circuit 26, and an input/output terminal 27.

In the pixel array unit 21, pixels 31 are arranged in a two-dimensional array. A pixel 31 includes a photodiode as a photoelectric conversion element, and pixel transistors.

The vertical drive circuit 22 is formed with a shift register, for example, selects a predetermined pixel drive line 41, supplies a pulse for driving the pixels 31 to the selected pixel drive line 41, and drives the pixels 31 on a row-by-row basis. That is, the vertical drive circuit 22 sequentially selects and scans the respective pixels 31 of the pixel array unit 21 on a row-by-row basis in the vertical direction, and supplies pixel signals based on the signal charges generated in accordance with the amounts of light received at the photodiodes of the respective pixels 31, to the column signal processing circuits 23 through vertical signal lines 42.

The column signal processing circuits 23 are provided for the respective columns of the pixels 31, and perform signal processing such as denoising, on a column-by-column basis, on signals that are output from the pixels 31 of one row. For example, the column signal processing circuits 23 perform signal processing, such as correlated double sampling (CDS) for removing fixed pattern noise inherent to the pixels, and analog/digital (A/D) conversion.

The horizontal drive circuit 24 is formed with a shift register, for example. The horizontal drive circuit 24 sequentially selects the respective column signal processing circuits 23 by sequentially outputting horizontal scan pulses, and causes the respective column signal processing circuits 23 to output pixel signals to a horizontal signal line 43.

The output circuit 25 performs signal processing on signals sequentially supplied from the respective column signal processing circuits 23 through the horizontal signal line 43, and outputs the processed signals. It should be noted that the output circuit 25 might perform only buffering, or might perform black level control, column variation correction, and various kinds of digital signal processing, for example.

The control circuit 26 controls operations of the respective components of the solid-state imaging device 10. For example, the control circuit 26 receives an input clock signal and data giving a command of an operation mode or the like, and outputs data of internal information and the like about the solid-state imaging device 10. That is, on the basis of a vertical synchronization signal, a horizontal synchronization signal, and a master clock signal, the control circuit 26 generates a clock signal and a control signal that serve as the references for operations of the vertical drive circuit 22, the column signal processing circuits 23, the horizontal drive circuit 24, and the like. The control circuit 26 outputs the generated clock signal and control signal to the vertical drive circuit 22, the column signal processing circuits 23, the horizontal drive circuit 24, and the like.

The input/output terminal 27 exchanges signals with the outside.

The solid-state imaging device 10 in FIG. 1 having the above configuration is a so-called column-A/D CMOS image sensor in which the column signal processing circuits 23 that perform CDS processes and A/D conversion processes are provided for the respective pixel columns. Alternatively, the solid-state imaging device 10 in FIG. 1 may be a back-illuminated CMOS image sensor.

2. First Embodiment

Figure 2:
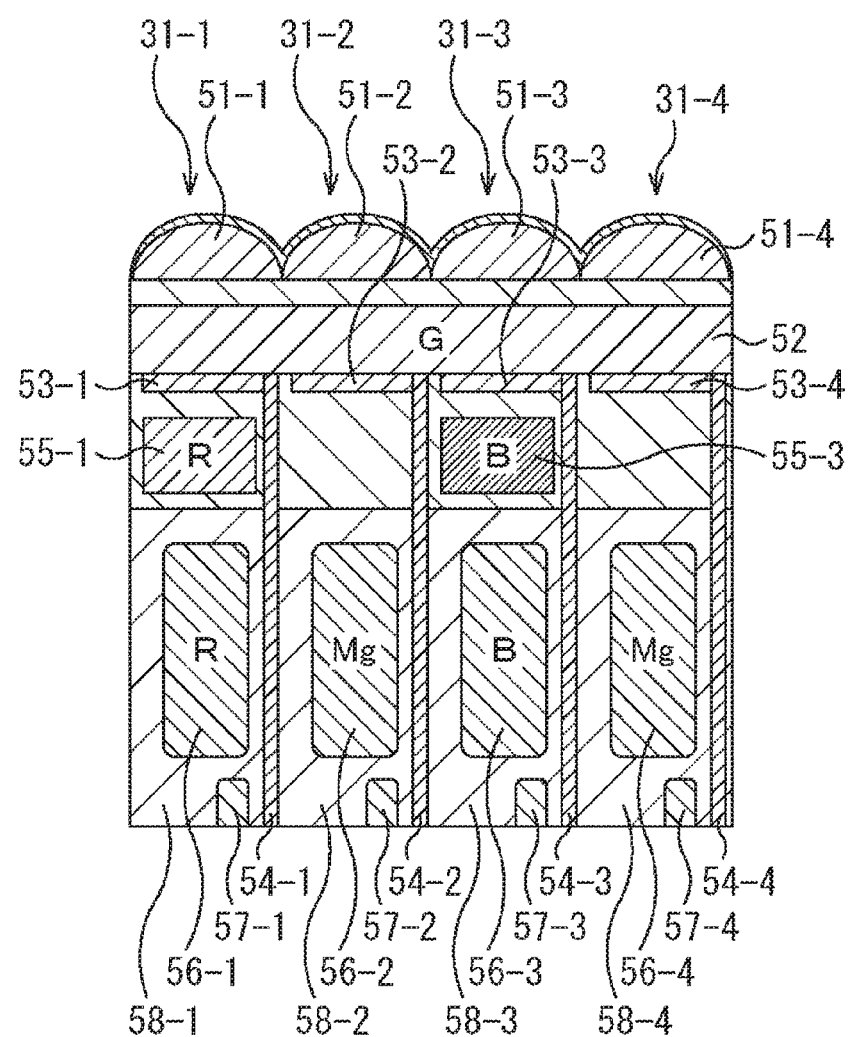
FIG. 2 is a cross-sectional diagram showing the structures of pixels in which a G organic photoelectric conversion film and R and B color filters are provided.

Next, the structure of a solid-state imaging device 10 according to a first embodiment is described in detail. FIG. 2 is an enlarged view of part of the solid-state imaging device 10 in FIG. 1, and is a cross-sectional diagram showing the structures of pixels 31 in which a G organic photoelectric conversion film and R and B color filters are provided. In FIG. 2, of the pixels 31 two-dimensionally arranged in the pixel array unit 21, four pixels 31-1 through 31-4 arranged in a row direction are shown as an example.

In the pixels 31-1 through 31-4, photodiodes 56-1 through 56-4 and charge retention units 57-1 through 57-4 are formed on a semiconductor substrate (a silicon substrate), and are buried in silicon (Si) layers 58-1 through 58-4. Also, above the semiconductor substrate, a G organic photoelectric conversion film 52 is also stacked, and lenses 51-1 through 51-4 are further formed. Also, of the pixels 31-1 through 31-4, the pixel 31-1 has an R color filter 55-1 formed below the G organic photoelectric conversion film 52 on the light incident side, and the pixel 31-3 has a B color filter 55-3 formed below the G organic photoelectric conversion film 52 on the light incident side. However, the pixel 31-2 and the pixel 31-4 do not have color filters formed therein.

In the pixel 31-1, light gathered by the lens 51-1 enters the G organic photoelectric conversion film 52. The G organic photoelectric conversion film 52 absorbs the light of the green (G) component from the incident light from the lens 51-1, and generates a signal charge corresponding to the light of the green (G) component. The signal charge generated by the G organic photoelectric conversion film 52 is extracted by a transparent electrode 53-1 provided in accordance with the pixel pitch, and is stored into the charge retention unit 57-1 via an electrode 54-1.

Meanwhile, of the incident light from the lens 51-1, the light that has passed through the G organic photoelectric conversion film 52 enters the R color filter 55-1. Here, the light to pass through the G organic photoelectric conversion film 52 is the light of the red (R) component and the light of the blue (B) component. Therefore, the light of the red (R) component is passed (the light of the blue (B) component is cut) by the R color filter 55-1, and enters the photodiode 56-1. The photodiode 56-1 generates a signal charge corresponding to the light of the red (R) component from the R color filter 55-1.

That is, in the pixel 31-1, the signal charges corresponding to the light of the green (G) component and the light of the red (R) component are generated.

In the pixel 31-2, light gathered by the lens 51-2 enters the G organic photoelectric conversion film 52. The G organic photoelectric conversion film 52 absorbs the light of the green (G) component from the incident light from the lens 51-2, and generates a signal charge corresponding to the light of the green (G) component. The signal charge generated by the G organic photoelectric conversion film 52 is extracted by a transparent electrode 53-2 provided in accordance with the pixel pitch, and is stored into the charge retention unit 57-2 via an electrode 54-2.

Here, the pixel 31-2 does not have any color filter formed therein, and therefore, the light that has passed through the G organic photoelectric conversion film 52 directly enters the photodiode 56-2. Also, the light to pass through the G organic photoelectric conversion film 52 is the light of the red (R) component and the light of the blue (B) component, and accordingly, the photodiode 56-2 generates a signal charge corresponding to the light of the component of magenta (Mg), which is a mixture of red (R) and blue (B).

That is, in the pixel 31-2, the signal charges corresponding to the light of the green (G) component and the light of the magenta (Mg) component are generated.

In the pixel 31-3, light gathered by the lens 51-3 enters the G organic photoelectric conversion film 52. The G organic photoelectric conversion film 52 absorbs the light of the green (G) component from the incident light from the lens 51-3, and generates a signal charge corresponding to the light of the green (G) component. The signal charge generated by the G organic photoelectric conversion film 52 is extracted by a transparent electrode 53-3 provided in accordance with the pixel pitch, and is stored into the charge retention unit 57-3 via an electrode 54-3.

Meanwhile, of the incident light from the lens 51-3, the light that has passed through the G organic photoelectric conversion film 52 enters the B color filter 55-3. Here, the light to pass through the G organic photoelectric conversion film 52 is the light of the red (R) component and the light of the blue (B) component. Therefore, the light of the blue (B) component is passed (the light of the red (R) component is cut) by the B color filter 55-3, and enters the photodiode 56-3. The photodiode 56-3 generates a signal charge corresponding to the light of the blue (B) component from the B color filter 55-3.

That is, in the pixel 31-3, the signal charges corresponding to the light of the green (G) component and the light of the blue (B) component are generated.

Like the pixel 31-2, the pixel 31-4 does not have any color filter formed therein. Therefore, the G organic photoelectric conversion film 52 absorbs the light of the green (G) component from the incident light from the lens 51-4, and generates a signal charge corresponding to the light of the green (G) component. Also, the photodiode 56-4 generates a signal charge corresponding to the light of the magenta (Mg) component, which is a mixture of the light of the red (R) component and the light of the blue (B) component that have passed through the G organic photoelectric conversion film 52.

That is, in the pixel 31-4, the signal charges corresponding to the light of the green (G) component and the light of the magenta (Mg) component are generated.

In the above manner, the signal charges generated by the pixels 31-1 through 31-4 are read out by a readout unit formed with pixel transistors, and are processed by a signal processing unit in a later stage. As a result, the signal charges are output as image data. Here, the signal processing unit in the later stage processes an RGB signal formed with signals corresponding to the green (G) component and the red (R) component in the output from the pixel 31-1, and signals corresponding to the green (G) component and the blue (B) component in the output from the pixel 31-3.

The signal processing unit in the later stage also processes a W signal corresponding to the white (W) component, as the signals corresponding to the green (G) component and the magenta (Mg) component obtained from the output from the pixel 31-2 are combined (added up). Likewise, a W signal corresponding to the white (W) component is processed, as the signals corresponding to the green (G) component and the magenta (Mg) component obtained from the output from the pixel 31-4 are combined (added up).

Figure 3:
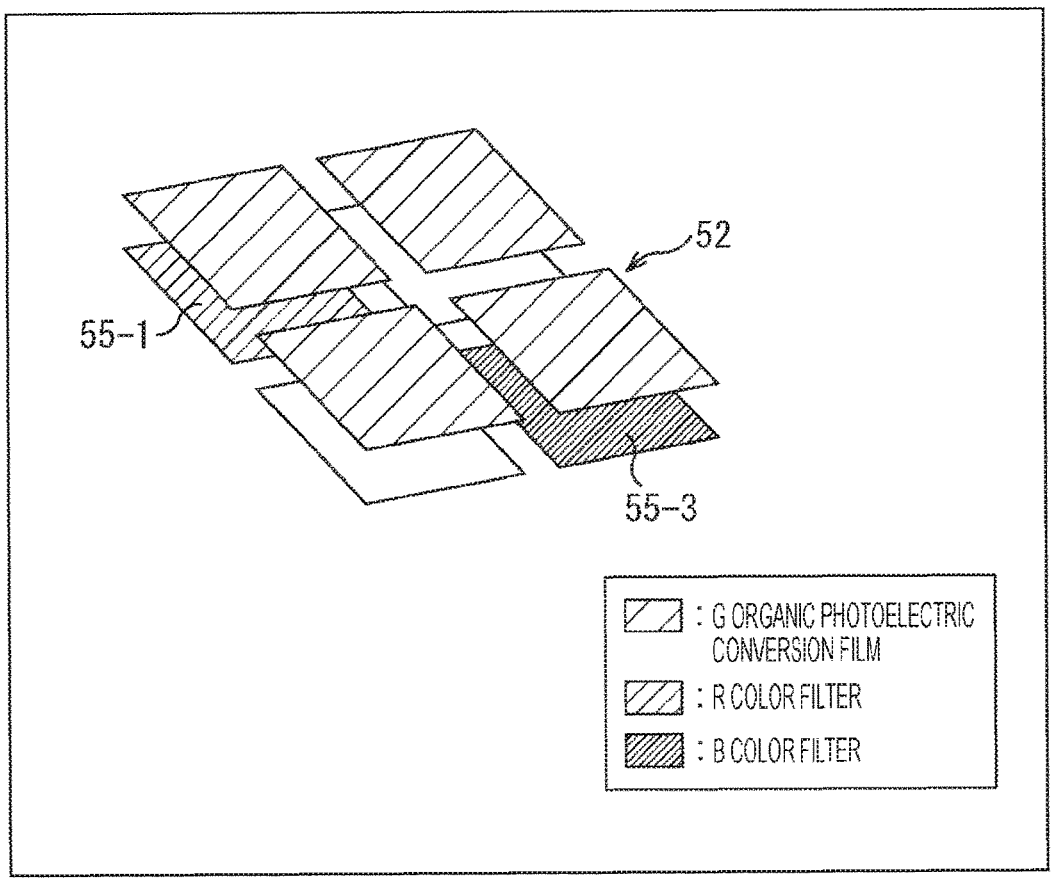
FIG. 3 is a diagram showing the relationship between the G organic photoelectric conversion provided in each pixel film and the R and B color filters.

As shown in FIG. 3, in the pixel array unit 21 according to the first embodiment, the G organic photoelectric conversion film 52 is formed for all the pixels 31. Also, the R color filter 55-1 and the B color filter 55-3 are formed below the G organic photoelectric conversion film 52. However, the R color filter 55-1 or the B color filter 55-3 is not formed for all the pixels 31, and there are pixels that do not have any color filter formed therein.

That is, in the pixel array unit 21 according to the first embodiment, the pixels 31 are arranged, with each 2×2 pixels being a repetitive unit. In each 2×2 pixels, the pixel (the pixel 31-1 in FIG. 2) having the R color filter 55-1 formed therein and the pixel (the pixel 31-3 in FIG. 2) having the B color filter 55-3 formed therein are diagonally positioned, and the pixels (the pixels 31-2 and 31-4 in FIG. 2) having no color filters formed therein are positioned in the remaining diagonal positions.

Then, in the pixel array unit 21 according to the first embodiment, 2×2 pixels formed with the pixels positioned as above are repeatedly placed, so that signal processing is performed on the output from the pixel (the pixel 31-1 in FIG. 2) having the G organic photoelectric conversion film 52 and the R color filter 55-1 formed therein, and the output from the pixel (the pixel 31-3 in FIG. 2) having the G organic photoelectric conversion film 52 and the B color filter 55-3 formed therein. Thus, an RGB signal is obtained. In the pixel array unit 21 according to the first embodiment, signal processing is also performed on the outputs from the two pixels (the pixels 31-2 and 31-4 in FIG. 2) having no color filters formed therein. Thus, a W signal is obtained.

In other words, in each 2×2 pixels, the signals corresponding to the green (G) component obtained from the pixels having the R color filter 55-1 and the B color filter 55-3 formed therein are used as image data through a demosaicing process. Also, in each 2×2 pixels, the signals corresponding to the green (G) component obtained from the pixels having no color filters formed therein are combined with (added to) the signals corresponding to the magenta (Mg) component through signal processing, and the resultant signal is used as a luminance signal.

As described above, in the first embodiment, pixels (the pixels 31-2 and 31-4 in FIG. 2) for increasing sensitivity are provided as pixels 31 to be disposed in the pixel array unit 21, so that a W signal as well as an RGB signal can be obtained. Thus, in a case where the solid-state imaging device 10 has a structure in which the G organic photoelectric conversion film 52 is stacked on a semiconductor substrate including the photodiodes 56, a higher resolution can be achieved while sensitivity is increased by a W signal.

3. Second Embodiment

Next, the structure of a solid-state imaging device 10 according to a second embodiment is described in detail.

Figure 4:
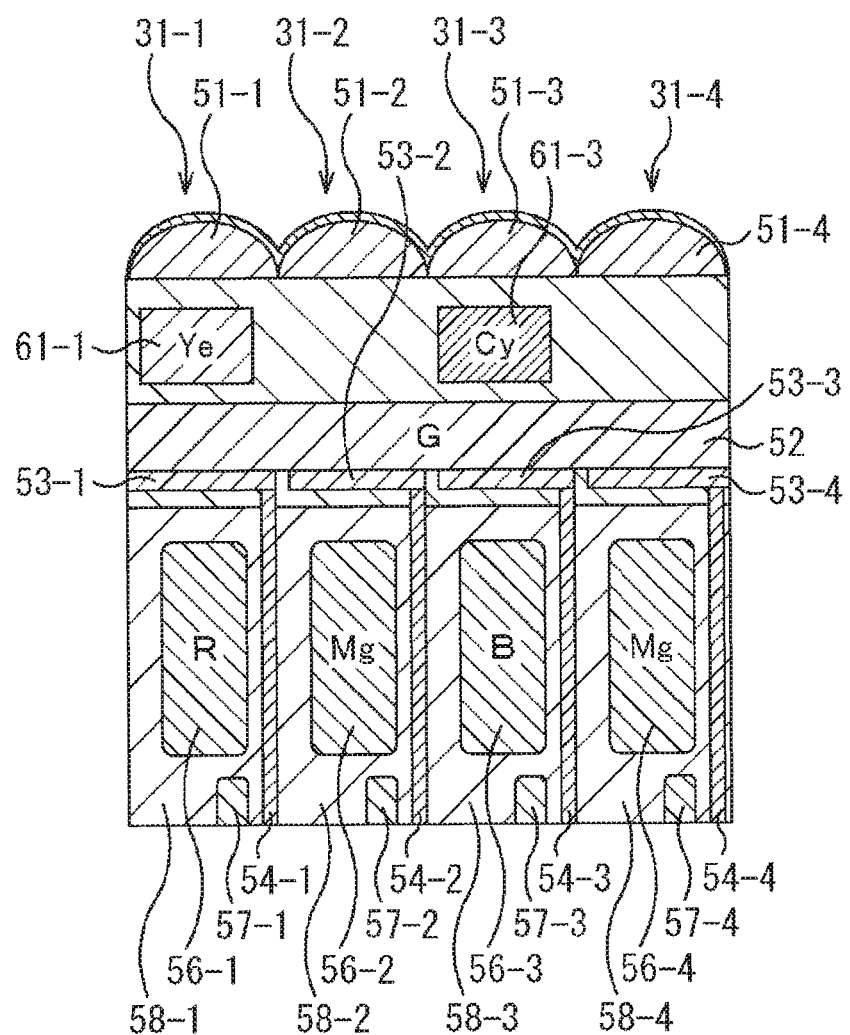
FIG. 4 is a cross-sectional diagram showing the structures of pixels in which a G organic photoelectric conversion film and Ye and Cy color filters are provided.

FIG. 4 is an enlarged view of part of the solid-state imaging device 10 in FIG. 1, and is a cross-sectional diagram showing the structures of pixels 31 in which a G organic photoelectric conversion film and Ye and Cy color filters are provided. In FIG. 4, of the pixels 31 two-dimensionally arranged in a pixel array unit 21, four pixels 31-1 through 31-4 arranged in a row direction are shown as an example.

In the pixels 31-1 through 31-4, photodiodes 56-1 through 56-4 and charge retention units 57-1 through 57-4 are formed on a semiconductor substrate (a silicon substrate), and are buried in silicon (Si) layers 58-1 through 58-4. Also, above the semiconductor substrate, a G organic photoelectric conversion film 52 is also stacked, and lenses 51-1 through 51-4 are further formed. Also, of the pixels 31-1 through 31-4, the pixel 31-1 has a Ye color filter 61-1 formed above the G organic photoelectric conversion film 52 on the light incident side, and the pixel 31-3 has a Cy color filter 61-3 formed above the G organic photoelectric conversion film 52 on the light incident side. However, the pixel 31-2 and the pixel 31-4 do not have color filters formed therein.

In the pixel 31-1, light gathered by the lens 51-1 enters the Ye color filter 61-1. Here, the light to pass through the Ye color filter 61-1 is the light of the yellow (Ye) component, or the light of a mixture of red (R) and green (G). Accordingly, the light of a mixture of red (R) and green (G) is passed by the Ye color filter 61-1, and enters the G organic photoelectric conversion film 52.

The G organic photoelectric conversion film 52 absorbs the light of the green (G) component from the incident light from the Ye color filter 61-1, and generates a signal charge corresponding to the light of the green (G) component. The signal charge generated by the G organic photoelectric conversion film 52 is extracted by a transparent electrode 53-1 provided in accordance with the pixel pitch, and is stored into the charge retention unit 57-1 via an electrode 54-1.

Meanwhile, the light that has passed through the G organic photoelectric conversion film 52 enters the photodiode 56-1. Here, the light to pass through the G organic photoelectric conversion film 52 is the light of the red (R) component, and accordingly, the photodiode 56-1 generates a signal charge corresponding to the light of the red (R) component that has passed through the G organic photoelectric conversion film 52.

That is, in the pixel 31-1, the signal charges corresponding to the light of the green (G) component and the light of the red (R) component are generated.

In the pixel 31-2, light gathered by the lens 51-2 enters the G organic photoelectric conversion film 52. The G organic photoelectric conversion film 52 absorbs the light of the green (G) component from the incident light from the lens 51-2, and generates a signal charge corresponding to the light of the green (G) component. The signal charge generated by the G organic photoelectric conversion film 52 is extracted by a transparent electrode 53-2 provided in accordance with the pixel pitch, and is stored into the charge retention unit 57-2 via an electrode 54-2.

Here, the pixel 31-2 does not have any color filter formed therein, and therefore, the light gathered by the lens 51-2 directly enters the G organic photoelectric conversion film 52, and the light that has passed through the G organic photoelectric conversion film 52 enters the photodiode 56-2. Also, the light to pass through the G organic photoelectric conversion film 52 is the light of the red (R) component and the light of the blue (B) component, and accordingly, the photodiode 56-2 generates a signal charge corresponding to the light of the component of magenta (Mg), which is a mixture of red (R) and blue (B).

That is, in the pixel 31-2, the signal charges corresponding to the light of the green (G) component and the light of the magenta (Mg) component are generated.

In the pixel 31-3, light gathered by the lens 51-3 enters the Cy color filter 61-3. Here, the light to pass through the Cy color filter 61-3 is the light of the cyan (Cy) component, or the light of a mixture of green (G) and blue (B). Accordingly, the Cy color filter 61-3 guides the light of a mixture of green (G) and blue (B) into the G organic photoelectric conversion film 52.

The G organic photoelectric conversion film 52 absorbs the light of the green (G) component from the incident light from the Cy color filter 61-3, and generates a signal charge corresponding to the light of the green (G) component. The signal charge generated by the G organic photoelectric conversion film 52 is extracted by a transparent electrode 53-3 provided in accordance with the pixel pitch, and is stored into the charge retention unit 57-3 via an electrode 54-3.

Meanwhile, the light that has passed through the G organic photoelectric conversion film 52 enters the photodiode 56-3. Here, the light to pass through the G organic photoelectric conversion film 52 is the light of the blue (B) component, and accordingly, the photodiode 56-3 generates a signal charge corresponding to the light of the blue (B) component that has passed through the G organic photoelectric conversion film 52.

That is, in the pixel 31-3, the signal charges corresponding to the light of the green (G) component and the light of the blue (B) component are generated.

Like the pixel 31-2, the pixel 31-4 does not have any color filter formed therein. Therefore, the G organic photoelectric conversion film 52 absorbs the light of the green (G) component from the incident light from the lens 51-4, and generates a signal charge corresponding to the light of the green (G) component. Also, the photodiode 56-4 generates a signal charge corresponding to the light of the magenta (Mg) component, which is a mixture of the light of the red (R) component and the light of the blue (B) component that have passed through the G organic photoelectric conversion film 52.

That is, in the pixel 31-4, the signal charges corresponding to the light of the green (G) component and the light of the magenta (Mg) component are generated.

In the above manner, the signal charges generated by the pixels 31-1 through 31-4 are read out by a readout unit formed with pixel transistors, and are processed by a signal processing unit in a later stage. As a result, the signal charges are output as image data. Here, the signal processing unit in the later stage processes an RGB signal formed with signals corresponding to the green (G) component and the red (R) component in the output from the pixel 31-1, and signals corresponding to the green (G) component and the blue (B) component in the output from the pixel 31-3.

The signal processing unit in the later stage also processes a W signal corresponding to the white (W) component, as the signals corresponding to the green (G) component and the magenta (Mg) component obtained from the output from the pixel 31-2 are combined (added up). Likewise, a W signal corresponding to the white (W) component is processed, as the signals corresponding to the green (G) component and the magenta (Mg) component obtained from the output from the pixel 31-4 are combined (added up).

Figure 5:
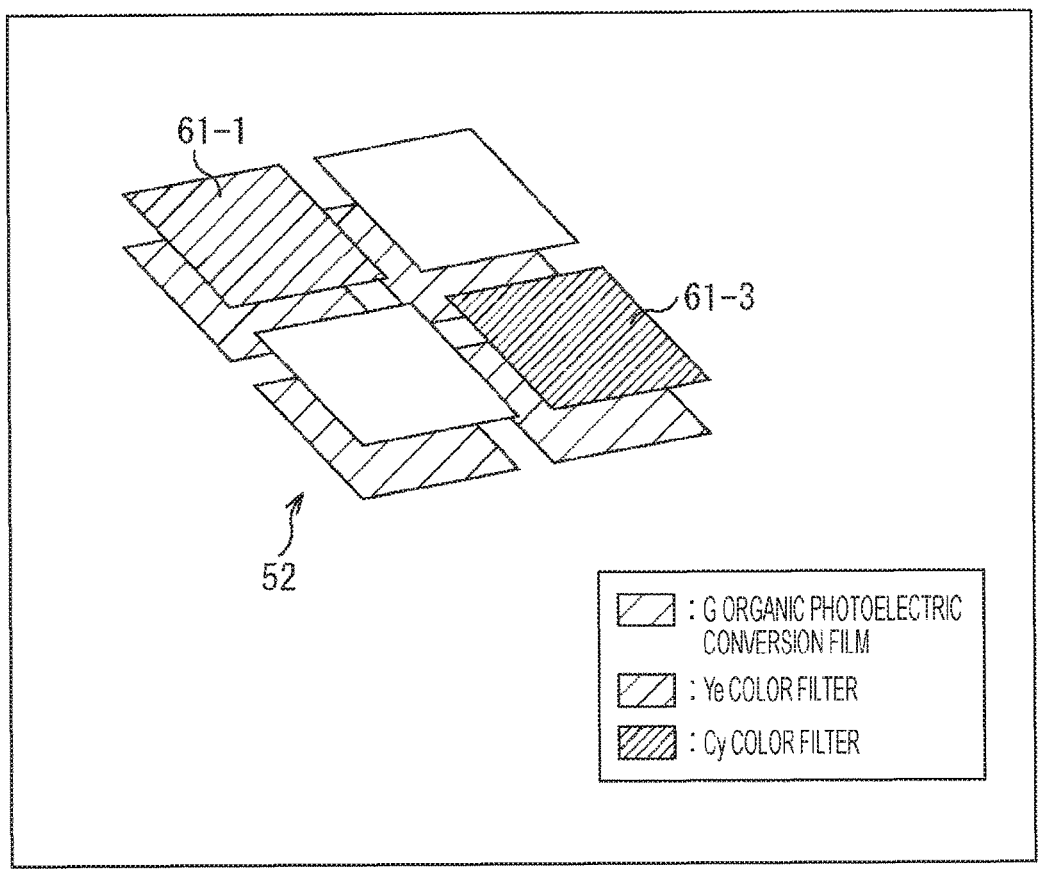
FIG. 5 is a diagram showing the relationship between the G organic photoelectric conversion provided in each pixel film and the Ye and Cy color filters.

As shown in FIG. 5, in the pixel array unit 21 according to the second embodiment, the G organic photoelectric conversion film 52 is formed for all the pixels 31. Also, the Ye color filter 61-1 and the Cy color filter 61-3 are formed above the G organic photoelectric conversion film 52. However, the Ye color filter 61-1 or the Cy color filter 61-3 is not formed for all the pixels 31, and there are pixels that do not have any color filter formed therein.

That is, in the pixel array unit 21 according to the second embodiment, the pixels 31 are arranged, with each 2×2 pixels being a repetitive unit. In each 2×2 pixels, the pixel (the pixel 31-1 in FIG. 4) having the Ye color filter 61-1 formed therein and the pixel (the pixel 31-3 in FIG. 4) having the Cy color filter 61-3 formed therein are diagonally positioned, and the pixels (the pixels 31-2 and 31-4 in FIG. 4) having no color filters formed therein are positioned in the remaining diagonal positions.

then, in the pixel array unit 21 according to the second embodiment, 2×2 pixels formed with the pixels positioned as above are repeatedly placed, so that signal processing is performed on the output from the pixel (the pixel 31-1 in FIG. 4) having the Ye color filter 61-1 and the G organic photoelectric conversion film 52 formed therein, and the output from the pixel (the pixel 31-3 in FIG. 4) having the Cy color filter 61-3 and the G organic photoelectric conversion film 52. Thus, an RGB signal is obtained. In the pixel array unit 21 according to the second embodiment, signal processing is also performed on the outputs from the two pixels (the pixels 31-2 and 31-4 in FIG. 4) having no color filters formed therein. Thus, a W signal is obtained.

In other words, in each 2×2 pixels, the signals corresponding to the green (G) component obtained from the pixels having the Ye color filter 61-1 and the Cy color filter 61-3 formed therein are used as image data through a demosaicing process. Also, in each 2×2 pixels, the signals corresponding to the green (G) component obtained from the pixels having no color filters formed therein are combined with (added to) the signals corresponding to the magenta (Mg) component through signal processing, and the resultant signal is used as a luminance signal.

As described above, in the second embodiment, pixels (the pixels 31-2 and 31-4 in FIG. 4) for increasing sensitivity are provided as pixels 31 to be disposed in the pixel array unit 21, so that a W signal as well as an RGB signal can be obtained. Thus, in a case where the solid-state imaging device 10 has a structure in which the G organic photoelectric conversion film 52 is stacked on a semiconductor substrate including the photodiodes 56, a higher resolution can be achieved while sensitivity is increased by a W signal.

4. Third Embodiment

Next, the structure of a solid-state imaging device 10 according to a third embodiment is described in detail. In the first embodiment and the second embodiment described above, a photodiode 56 is buried in a silicon (Si) layer 58 in each pixel 31. In the back-illuminated solid-state imaging device 10, each pixel 31 has such a buried photodiode structure. Accordingly, an area for the pixel transistor for control use is formed, and pixel transistors can be stacked on the photodiode 56 on the wiring layer side.

5. Fourth Embodiment

Figure 6:
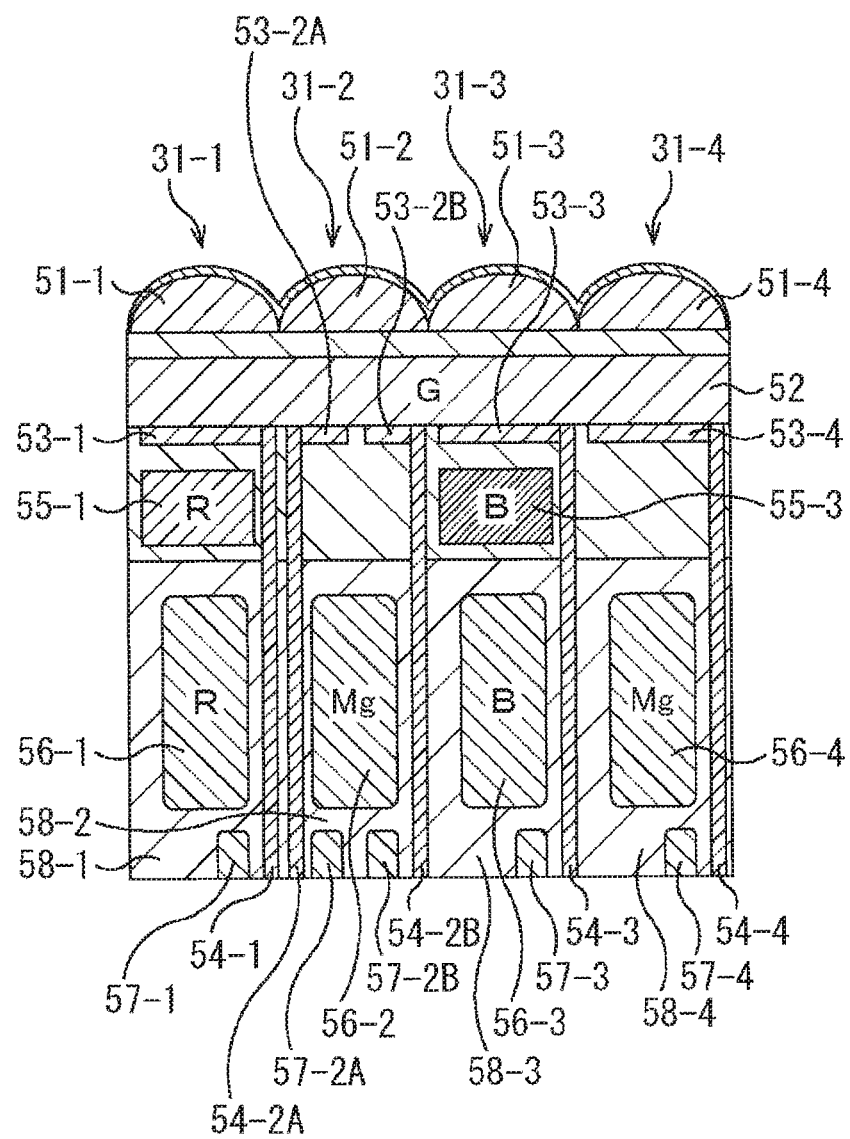
FIG. 6 is a cross-sectional diagram showing the structures of pixels in which a transparent electrode is divided.

Next, the structure of a solid-state imaging device 10 according to a fourth embodiment is described in detail. FIG. 6 is an enlarged view of part of the solid-state imaging device 10 in FIG. 1, and is a cross-sectional diagram showing the structures of pixels 31 in which a transparent electrode 53 is divided.

In FIG. 6, a pixel 31-1, a pixel 31-3, and a pixel 31-4 have structures similar to the structures of the pixel 31-1, the pixel 31-3, and the pixel 31-4 in FIG. 2, but the structure of a pixel 31-2 differs from the structure of the pixel 31-2 in FIG. 2.

Specifically, in the pixel 31-2 in FIG. 6, a transparent electrode 53-2 is divided into a transparent electrode 53-2A and a transparent electrode 53-2B. The transparent electrode 53-2A extracts a signal charge that is generated by a G organic photoelectric conversion film 52 and corresponds to light of the green (G) component, and stores the signal charge into a charge retention unit 57-2A via an electrode 54-2A. The transparent electrode 53-2B extracts a signal charge that is generated by the G organic photoelectric conversion film 52 and corresponds to light of the green (G) component, and stores the signal charge into a charge retention unit 57-2B via an electrode 54-2B.

Here, the pixel 31-2 in FIG. 6 does not have any color filter formed therein, and therefore, the light that has passed through the G organic photoelectric conversion film 52 directly enters a photodiode 56-2. Also, the light to pass through the G organic photoelectric conversion film 52 is the light of the red (R) component and the light of the blue (B) component, and accordingly, the photodiode 56-2 generates a signal charge corresponding to the light of the component of magenta (Mg), which is a mixture of red (R) and blue (B).

That is, in the pixel 31-2 in FIG. 6, signal charges corresponding to the light of the green (G) component and the light of the magenta (Mg) component are generated, but the signal charges generated by the G organic photoelectric conversion film 52 are extracted by the pair of the transparent electrode 53-2A and the transparent electrode 53-2B. Using these signal charges as phase difference detection signals, the signal processing unit in a later stage can achieve autofocusing by a technique utilizing an image plane phase difference. In other words, the pixel 31-2 can be regarded as a pixel with a phase difference detection function designed to detect a phase difference (a phase difference detection pixel). It should be noted that the pixel 31-4 may also be used as a pixel for phase difference detection (a phase difference detection pixel).

It should be noted that although the structure of the solid-state imaging device 10 shown in FIG. 6 is a structure corresponding to the first embodiment (basic structure 1: G organic photoelectric conversion film+R and B color filters), a structure corresponding to the second embodiment (basic structure 2: G organic photoelectric conversion film+Ye and Cy color filters) may also be used.

6. Fifth Embodiment

Figure 7:
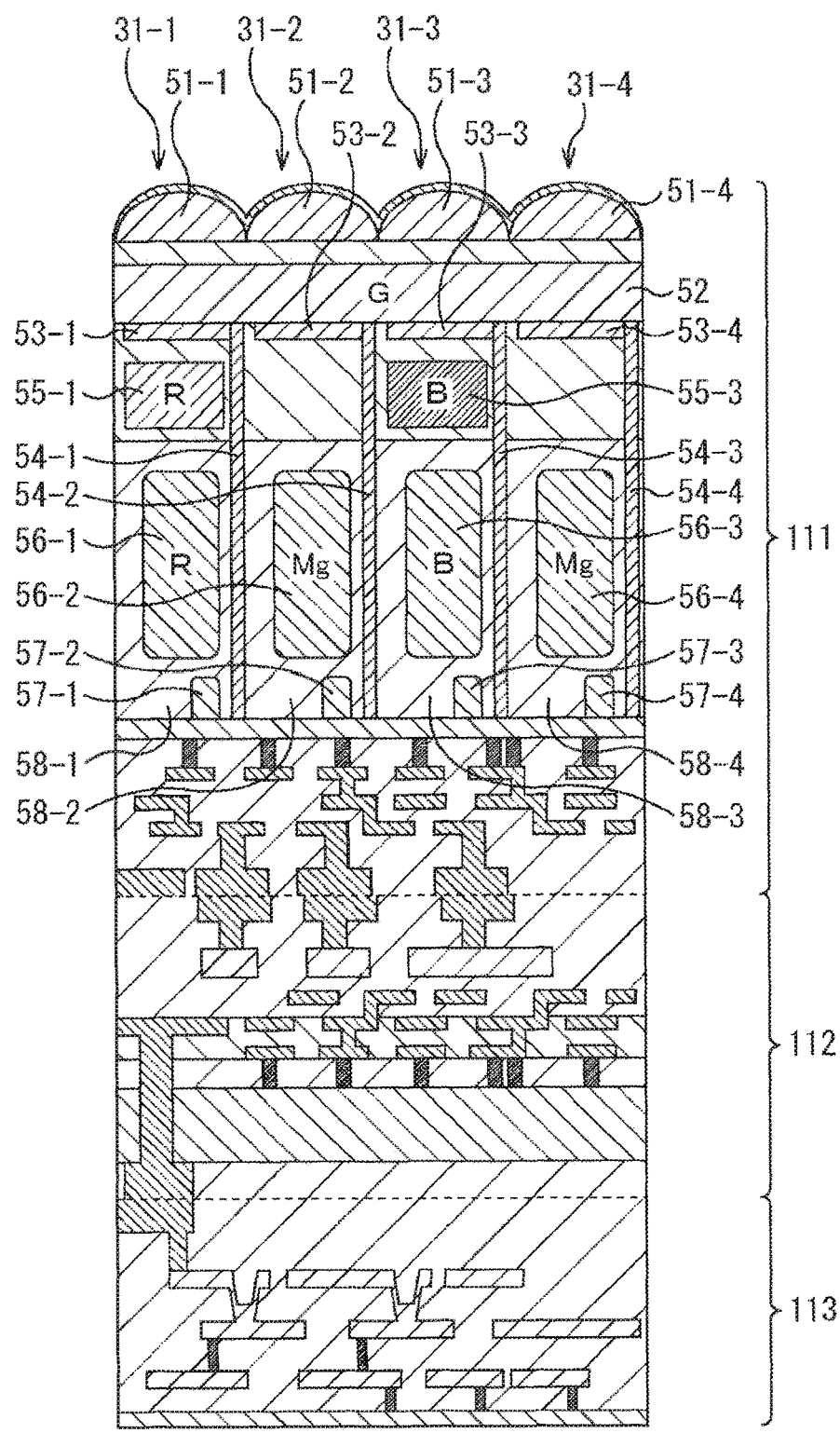
FIG. 7 is a cross-sectional diagram showing the structures of pixels in a case where semiconductor substrates are stacked.

Next, the structure of a solid-state imaging device 10 according to a fifth embodiment is described in detail. FIG. 7 is an enlarged view of part of the solid-state imaging device 10 in FIG. 1, and is a cross-sectional diagram showing the structures of pixels 31 in a case where semiconductor substrates are stacked.

In FIG. 7, a first semiconductor substrate 111 including a sensor circuit, a second semiconductor substrate 112 including a logic circuit, and a third semiconductor substrate 113 including a memory circuit are stacked. The three semiconductor substrates are stacked, with the uppermost layer being the first semiconductor substrate 111, followed by the second semiconductor substrate 112 and the third semiconductor substrate 113 in this order.

The sensor circuit of the first semiconductor substrate 111 has a structure corresponding to the first embodiment. The logic circuit of the second semiconductor substrate 112 includes the signal processing circuit that performs signal processing to control the pixels 31 two-dimensionally arranged in the pixel array unit 21 or control communication with the outside. Meanwhile, the memory circuit of the third semiconductor substrate 113 is a circuit that temporarily stores signals.

Where the above stack structure is employed, the respective circuits can be appropriately designed to match the functions of the respective semiconductor substrates. Thus, it is possible to readily achieve a more sophisticated solid-state imaging device 10. For example, a sensor circuit, a logic circuit, and a memory circuit are appropriately formed to match the respective functions of the first semiconductor substrate 111, the second semiconductor substrate 112, and the third semiconductor substrate 113, and the pixels 31 two-dimensionally arranged in the pixel array unit 21 are designed to form a shared pixel structure. In this manner, a higher processing speed can be achieved. This shared pixel structure includes photodiodes 56, transfer transistors, a shared floating diffusion, and one of other shared pixel transistors, for example.

It should be noted that although the structure of the solid-state imaging device 10 shown in FIG. 7 is a structure corresponding to the first embodiment (basic structure 1: G organic photoelectric conversion film+R and B color filters), a structure corresponding to the second embodiment (basic structure 2: G organic photoelectric conversion film+Ye and Cy color filters) may also be used.

As described above, in the first through fifth embodiments, the photodiodes 56 are formed in a semiconductor substrate, and the G organic photoelectric conversion film 52 is stacked on the light incident side of the semiconductor substrate. In this manner, the sensitivity to the green (G) component can be increased, and a larger number of pixels can be used, without any degradation in pixel characteristics.

In the first embodiment, pixels having no color filters formed therein (the pixels 31-2 and 31-4), as well as pixels having the R color filter 55-1 or the B color filter 55-3 formed therein (the pixels 31-1 and 31-3), are provided, so that a W signal corresponding to the white (W) component can be generated by combining (adding up) the signals corresponding to the green (G) component and the magenta (Mg) component. With this, a higher resolution can be achieved while sensitivity is increased. Also, incident light loss can be reduced.

Likewise, in the second embodiment, pixels having no color filters formed therein (the pixels 31-2 and 31-4), as well as pixels having the Ye color filter 61-1 or the Cy color filter 61-3 formed therein (the pixels 31-1 and 31-3), are provided, so that a W signal corresponding to the white (W) component can be generated by combining (adding up) the signals corresponding to the green (G) component and the magenta (Mg) component. With this, a higher resolution can be achieved while sensitivity is increased. Also, incident light loss can be reduced.

7. Configurations of Camera Modules

The present technology is not necessarily applied to a solid-state imaging device. Specifically, the present technology can be applied not only to solid-state imaging devices but also to any electronic apparatuses having solid-state imaging devices therein, such as camera modules having optical lens systems or the like, imaging apparatuses such as digital still cameras and video cameras, mobile terminal devices (smartphones and tablets, for example) having imaging functions, or copying machines that use solid-state imaging devices as the image reading units.

Figure 8:
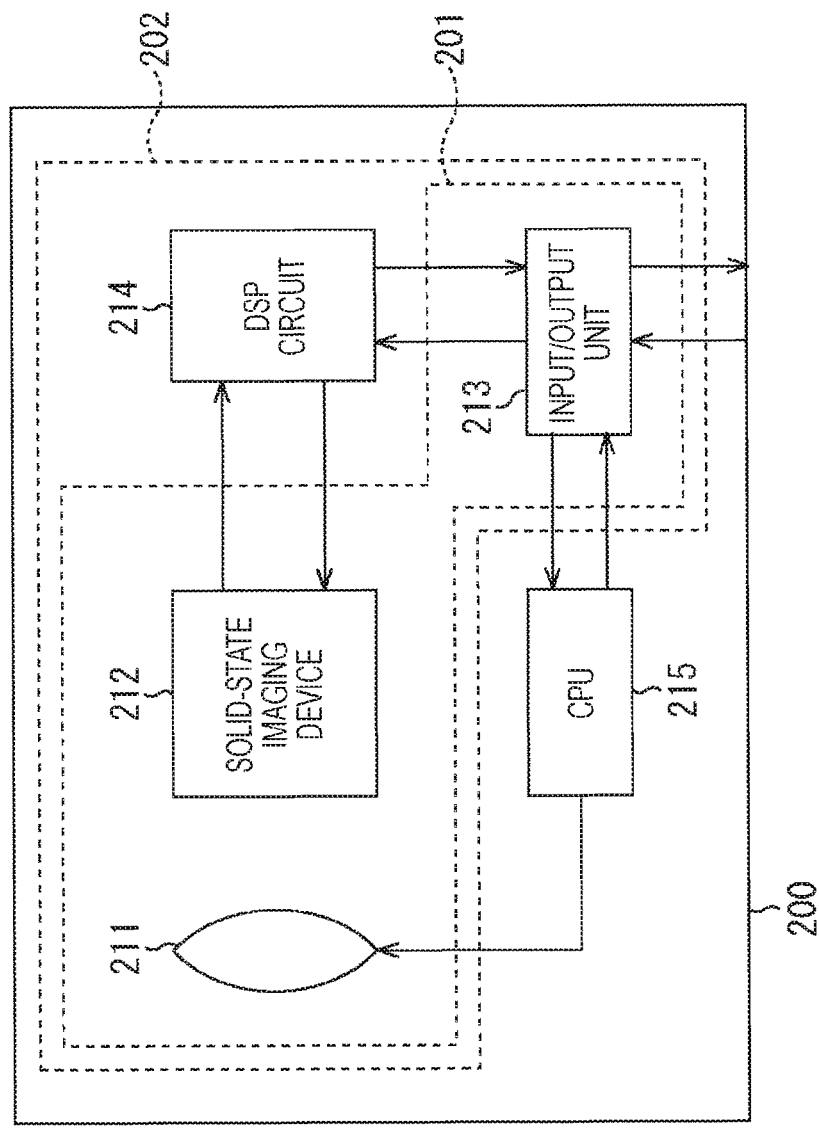
FIG. 8 is a diagram showing an example configuration of a camera module including a solid-state imaging device.

FIG. 8 is a diagram showing an example configuration of a camera module including a solid-state imaging device.

In FIG. 8, a camera module 200 is a module into which an optical lens system 211, a solid-state imaging device 212, an input/output unit 213, a digital signal processor (DSP) circuit 214, and a CPU 215 are incorporated.

The solid-state imaging device 212 is equivalent to the solid-state imaging device 10 in FIG. 1, and has the cross-section structure in FIG. 2, for example. That is, in the solid-state imaging device 212, pixels for increasing sensitivity (the pixels 31-2 and 31-4 in FIG. 2, for example) are provided. The solid-state imaging device 212 captures incident light (image light) from the object via the optical lens system 211, converts the amount of the incident light gathered on the imaging surface into an electrical signal on a pixel-by-pixel basis, and outputs the electrical signal as a pixel signal. The input/output unit 213 serves as an input/output interface with the outside.

The DSP circuit 214 is a signal processing circuit that processes signals supplied from the solid-state imaging device 212. For example, this signal processing circuit processes an RGB signal formed from signals corresponding to the green (G) component and the red (R) component in an output from the pixel 31-1 (FIG. 2), and signals corresponding to the green (G) component and the blue (B) component in an output from the pixel 31-3 (FIG. 2).

The signal processing circuit also obtains a W signal by combining the signals corresponding to the green (G) component and the magenta (Mg) component obtained from an output from the pixel 31-2 (FIG. 2). Likewise, the signal processing circuit also obtains a W signal by combining the signals corresponding to the green (G) component and the magenta (Mg) component obtained from an output from the pixel 31-4 (FIG. 2). It should be noted that the above processing to be performed by the signal processing circuit may be performed by the solid-state imaging device 212.

The CPU 215 controls the optical lens system 211, and exchange data with the input/output unit 213.

Alternatively, a camera module 201 may be a module formed only with the optical lens system 211, the solid-state imaging device 212, and the input/output unit 213, for example. In this case, pixel signals from the solid-state imaging device 212 are output via the input/output unit 213. Further, a camera module 202 may be a module formed with the optical lens system 211, the solid-state imaging device 212, the input/output unit 213, and the DSP circuit 214. In this case, pixel signals from the solid-state imaging device 212 are processed by the DSP circuit 214, and are output via the input/output unit 213.

The camera modules 200, 201, and 202 are configured as above. As the camera modules 200, 201, and 202 each include the solid-state imaging device 212 in which pixels for increasing sensitivity (the pixels 31-2 and 31-4 in FIG. 2, for example) are provided, a W signal as well as an RGB signal can be obtained. Thus, a higher resolution can be achieved while sensitivity is increased by the W signal.

8. Configuration of an Electronic Apparatus

Figure 9:
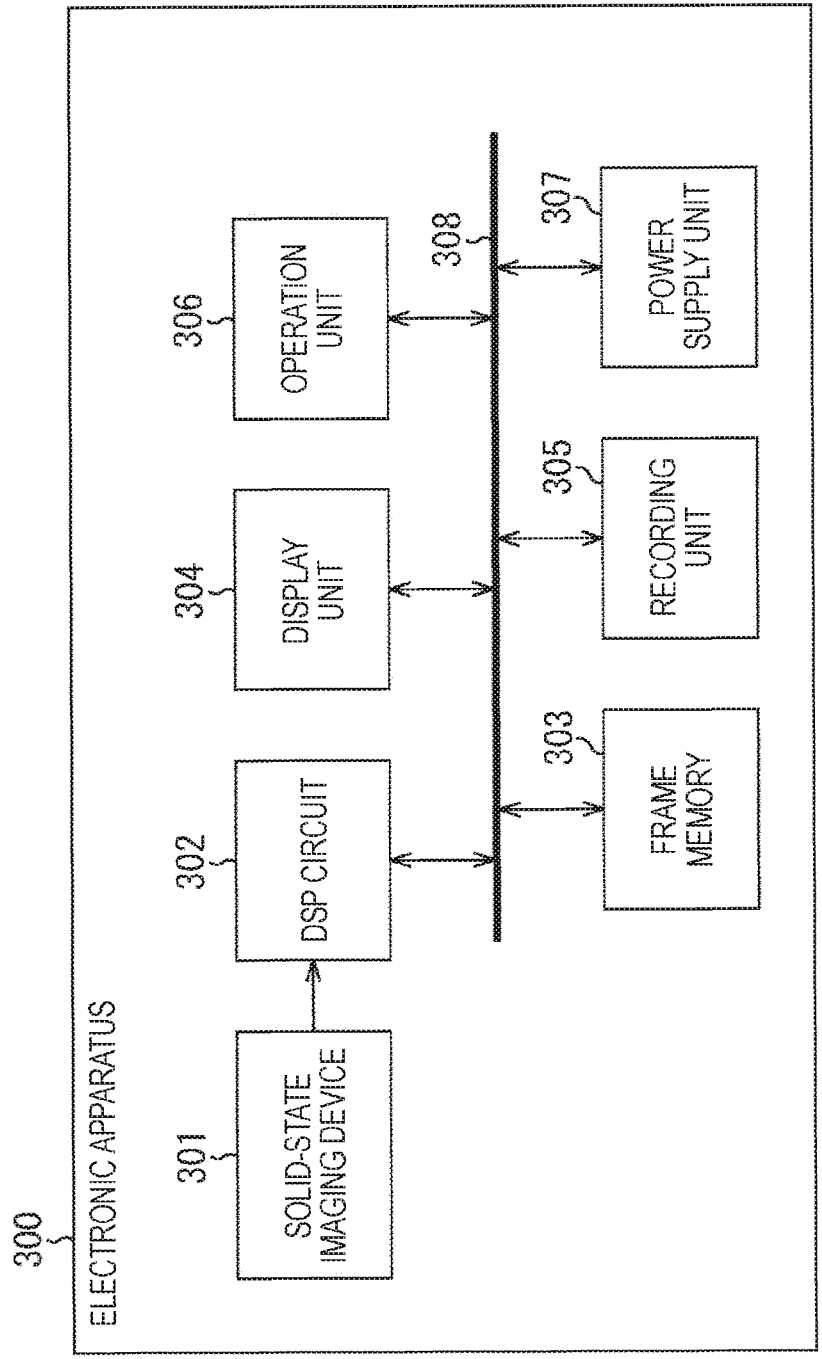
FIG. 9 is a diagram showing an example configuration of an electronic apparatus including a solid-state imaging device.

FIG. 9 is a diagram showing an example configuration of an electronic apparatus including a solid-state imaging device.

An electronic apparatus 300 in FIG. 9 is an electronic apparatus, such as an imaging apparatus like a digital still camera or a video camera, or a mobile terminal device like a smartphone or a tablet.

In FIG. 9, the electronic apparatus 300 includes a solid-state imaging device 301, a DSP circuit 302, a frame memory 303, a display unit 304, a recording unit 305, an operation unit 306, and a power supply unit 307. Also, in the electronic apparatus 300, the DSP circuit 302, the frame memory 303, the display unit 304, the recording unit 305, the operation unit 306, and the power supply unit 307 are connected to one another via a bus line 308.

The solid-state imaging device 301 is equivalent to the solid-state imaging device 10 in FIG. 1, and has the cross-section structure in FIG. 2, for example. That is, in the solid-state imaging device 212, pixels for increasing sensitivity (the pixels 31-2 and 31-4 in FIG. 2, for example) are provided. The solid-state imaging device 301 captures incident light (image light) from the object via an optical lens system (not shown), converts the amount of the incident light gathered on the imaging surface into an electrical signal on a pixel-by-pixel basis, and outputs the electrical signal as a pixel signal.

The DSP circuit 302 is a signal processing circuit that processes signals supplied from the solid-state imaging device 301, and is equivalent to the DSP circuit 214 in FIG. 8. The DSP circuit 302 outputs image data obtained by processing the signals from the solid-state imaging device 301. The frame memory 303 temporarily stores, on a frame-by-frame basis, the image data processed by the DSP circuit 302.

The display unit 304 is formed with a panel display device such as a liquid crystal panel or an organic electro-luminescence (EL) panel, and displays a moving image or a still image formed by the solid-state imaging device 301. The recording unit 305 records the image data of the moving image or the still image formed by the solid-state imaging device 301 into a recording medium such as a semiconductor memory or a hard disk.

The operation unit 306 outputs operation instructions as to the various functions of the electronic apparatus 300, in accordance with operations performed by the user. The power supply unit 307 supplies the DSP circuit 302, the frame memory 303, the display unit 304, the recording unit 305, and the operation unit 306 with various power sources as the operation power sources for these supply destinations, as appropriate.

The electronic apparatus 300 is configured as above. As the electronic apparatus 300 includes the solid-state imaging device 212 in which pixels for increasing sensitivity (the pixels 31-2 and 31-4 in FIG. 2, for example) are provided, a W signal as well as an RGB signal can be obtained. Thus, a higher resolution can be achieved while sensitivity is increased by the W signal.

9. Examples of Use of a Solid-State Imaging Device

Figure 10:
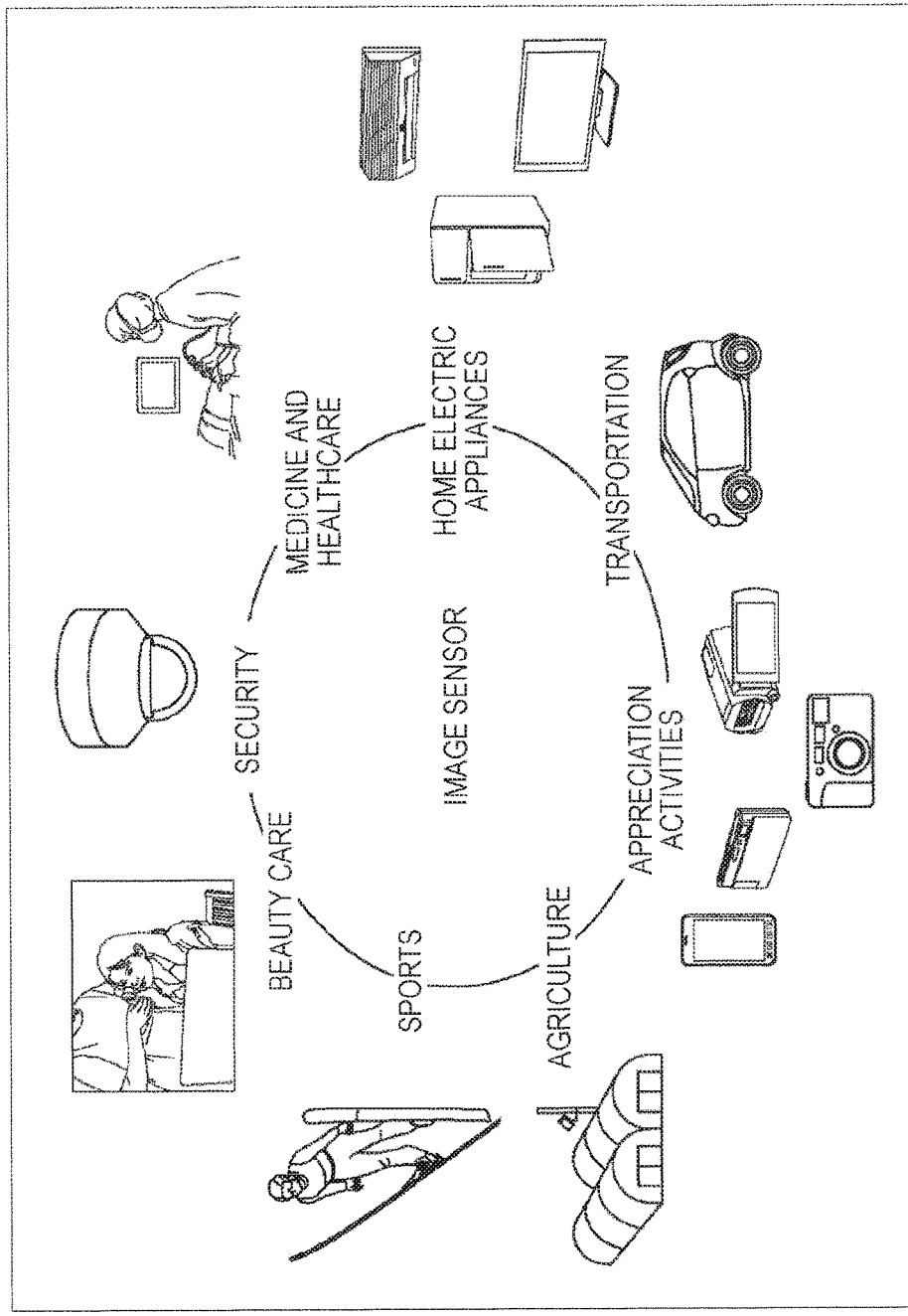
FIG. 10 is a diagram showing examples of use of a solid-state imaging device.

FIG. 10 is a diagram showing examples of use of the solid-state imaging device 10 as an image sensor.

The above described solid-state imaging device 10 can be used in various cases where light such as visible light, infrared light, ultraviolet light, or an X-ray is sensed, as described below. That is, as shown in FIG. 10, the solid-state imaging device 10 can be used in an apparatus that is used not only in the appreciation activity field where images are taken and are used in appreciation activities as described above, but also in the field of transportation, the field of home electric appliances, the fields of medicine and healthcare, the field of security, the field of beauty care, the field of sports, or the field of agriculture, for example.

Specifically, in the appreciation activity field, the solid-state imaging device 10 can be used in an apparatus (the electronic apparatus 300 in FIG. 9, for example) for taking images to be used in appreciation activities, such as a digital camera, a smartphone, or a mobile telephone with a camera function, as described above.

In the field of transportation, the solid-state imaging device 10 can be used in an apparatus for transportation use, such as a vehicle-mounted sensor configured to take images of the front, the back, the surroundings, and the inside of an automobile to perform safe driving like an automatic stop and recognize a driver's condition, a surveillance camera for monitoring running vehicles and the roads, or a ranging sensor for measuring a distance between vehicles.

In the field of home electric appliances, the solid-state imaging device 10 can be used in an apparatus to be used as home electric appliance, such as a television set, a refrigerator, or an air conditioner, to take images of gestures of users and operate the apparatus in accordance with the gestures. Also, in the fields of medicine and healthcare, the solid-state imaging device 10 can be used in an apparatus for medical use or healthcare use, such as an endoscope or an apparatus for receiving infrared light for angiography.

In the field of security, the solid-state imaging device 10 can be used in an apparatus for security use, such as a surveillance camera for crime prevention or a camera for personal authentication. Also, in the field of beauty care, the solid-state imaging device 10 can be used in an apparatus for beauty care use, such as a skin measurement apparatus configured to image the skin or a microscope for imaging the scalp.

In the field of sports, the solid-state imaging device 10 can be used in an apparatus for sporting use, such as an action camera or a wearable camera for sports. Also, in the field of agriculture, the solid-state imaging device 10 can be used in an apparatus for agricultural use, such as a camera for monitoring conditions of fields and crops.

It should be noted that embodiments of the present technology are not limited to the above described embodiments, and various modifications may be made to them without departing from the scope of the present technology. For example, it is possible to employ a combination of all or some of the above described embodiments.

The present technology may also be embodied in the configurations described below.

(1)

A solid-state imaging device including
a pixel array unit in which a plurality of pixels are two-dimensionally arranged,
each of the pixels including:
a first photoelectric conversion unit that generates a signal charge by absorbing light of a first color component; and
a second photoelectric conversion unit that generates a signal charge in accordance with an amount of incident light, the second photoelectric conversion unit being formed with a photodiode,
wherein:
the pixels two-dimensionally arranged in the pixel array unit are formed with a combination of:
a first pixel that performs
photoelectric conversion on light of the first color component with the first photoelectric conversion unit, and
photoelectric conversion on light of a third color component with the second photoelectric conversion unit, the light of the third color component having passed through a first color filter and the first photoelectric conversion unit, the first color filter being configured to pass light of a second color component;
a second pixel that performs
photoelectric conversion on light of the first color component with the first photoelectric conversion unit, and
photoelectric conversion on light of a fifth color component with the second photoelectric conversion unit, the light of the fifth color component having passed through a second color filter and the first photoelectric conversion unit, the second color filter being configured to pass light of a fourth color component; and
a third pixel that performs
photoelectric conversion on light of the first color component with the first photoelectric conversion unit, and
photoelectric conversion on light of a sixth color component with the second photoelectric conversion unit, the light of the sixth color component having passed through the first photoelectric conversion unit; and
the first color component and the sixth color component are mixed, to generate white (W).

(2)

The solid-state imaging device of (1), wherein:
the first color filter and the second color filter are disposed below the first photoelectric conversion unit on a light incident side;
the first color component is green (G);
the second color component is red (R);
the third color component is red (R);
the fourth color component is blue (B);
the fifth color component is blue (B); and
the sixth color component is magenta (Mg).

(3)

The solid-state imaging device of (2), wherein, in the pixel array unit,
the pixels are arranged, with 2×2 pixels being a repetitive unit, and,
in each 2×2 pixels, the first pixel and the second pixel are diagonally positioned, and the third pixels are disposed in the remaining diagonal positions.

(4)

The solid-state imaging device of (2) or (3), wherein:
the photodiode is formed as a buried photodiode; and
a pixel transistor for control is formed on a wiring layer side of the photodiode.

(5)

The solid-state imaging device of any of (2) to (4), wherein the third pixel is formed as a pixel for phase difference detection, the third pixel including divided transparent electrodes, the transparent electrodes each extracting a signal charge generated by the first photoelectric conversion unit.

(6)

The solid-state imaging device of any of (2) to (5), wherein
three semiconductor substrates are stacked,
the three semiconductor substrates are
a first semiconductor substrate having a sensor circuit including the first photoelectric conversion unit and the second photoelectric conversion unit,
a second semiconductor substrate having a logic circuit, and
a third semiconductor substrate having a memory circuit,
the uppermost layer being the first semiconductor substrate, the lowermost layer being the third semiconductor substrate, the second semiconductor substrate being in the middle.

(7)
The solid-state imaging device of (1), wherein:
the first color filter and the second color filter are disposed above the first photoelectric conversion unit on a light incident side;
the first color component is green (G);
the second color component is yellow (Ye);
the third color component is red (R);
the fourth color component is cyan (Cy);
the fifth color component is blue (B); and
the sixth color component is magenta (Mg).
(8)
The solid-state imaging device of (7), wherein, in the pixel array unit,
the pixels are arranged, with 2×2 pixels being a repetitive unit, and,
in each 2×2 pixels, the first pixel and the second pixel are diagonally positioned, and the third pixels are disposed in the remaining diagonal positions.
(9)
The solid-state imaging device of (7) or (8), wherein:
the photodiode is formed as a buried photodiode; and
a pixel transistor for control is formed on a wiring layer side of the photodiode.
(10)
The solid-state imaging device of any of (7) to (9), wherein the third pixel is formed as a pixel for phase difference detection, the third pixel including divided transparent electrodes, the transparent electrodes each extracting a signal charge generated by the first photoelectric conversion unit.
(11)
The solid-state imaging device of any of (7) to (10), wherein
three semiconductor substrates are stacked,
the three semiconductor substrates are
a first semiconductor substrate having a sensor circuit including the first photoelectric conversion unit and the second photoelectric conversion unit,
a second semiconductor substrate having a logic circuit, and
a third semiconductor substrate having a memory circuit,
the uppermost layer being the first semiconductor substrate, the lowermost layer being the third semiconductor substrate, the second semiconductor substrate being in the middle.
(12)
An electronic apparatus including
a solid-state imaging device including
a pixel array unit in which a plurality of pixels are two-dimensionally arranged,
each of the pixels including:
a first photoelectric conversion unit that generates a signal charge by absorbing light of a first color component; and
a second photoelectric conversion unit that generates a signal charge in accordance with an amount of incident light, the second photoelectric conversion unit being formed with a photodiode,
wherein:
the pixels two-dimensionally arranged in the pixel array unit are formed with a combination of:
a first pixel that performs
photoelectric conversion on light of the first color component with the first photoelectric conversion unit, and
photoelectric conversion on light of a third color component with the second photoelectric conversion unit, the light of the third color component having passed through a first color filter and the first photoelectric conversion unit, the first color filter being configured to pass light of a second color component;
a second pixel that performs
photoelectric conversion on light of the first color component with the first photoelectric conversion unit, and
photoelectric conversion on light of a fifth color component with the second photoelectric conversion unit, the light of the fifth color component having passed through a second color filter and the first photoelectric conversion unit, the second color filter being configured to pass light of a fourth color component; and
a third pixel that performs
photoelectric conversion on light of the first color component with the first photoelectric conversion unit, and
photoelectric conversion on light of a sixth color component with the second photoelectric conversion unit, the light of the sixth color component having passed through the first photoelectric conversion unit; and
the first color component and the sixth color component are mixed, to generate white (W).

REFERENCE SIGNS LIST

10 Solid-state imaging device
21 Pixel array unit
31 Pixel
23 Column signal processing circuit
26 Control circuit
51 Lens
52 G organic photoelectric conversion film
53 Transparent electrode
54 Electrode
55-1 R color filter
55-3 B color filter
56 Photodiode
57 Charge retention unit
58 Silicon layer
61-1 Ye color filter
61-3 Cy color filter
111 First semiconductor substrate
112 Second semiconductor substrate
113 Third semiconductor substrate
200, 201, 202 Camera module
212 Solid-state imaging device
300 Electronic apparatus
301 Solid-state imaging device

The invention claimed is:
1. A solid-state imaging device comprising:
a pixel array unit including a plurality of pixels, wherein the plurality of pixels are in a two-dimensionally array in the pixel array unit,
wherein each pixel of the plurality of pixels comprises:
a first photoelectric conversion unit configured to generate a signal charge based on light absorbed of a first color component; and
a second photoelectric conversion unit configured to generate a signal charge that corresponds to an amount of incident light,
wherein the second photoelectric conversion unit comprises a photodiode, and
wherein the plurality of pixels comprise:
a first pixel configured to:
photoelectrically convert light of the first color component with the first photoelectric conversion unit, and photoelectrically convert light of a third color component with the second photoelectric conversion unit,
wherein the light of the third color component passes through a first color filter and the first photoelectric conversion unit, and
wherein light of a second color component passes through the first color filter;
a second pixel configured to:
photoelectrically convert the light of the first color component with the first photoelectric conversion unit, and
photoelectrically convert light of a fifth color component with the second photoelectric conversion unit,
wherein the light of the fifth color component passes through a second color filter and the first photoelectric conversion unit,
wherein light of a fourth color component passes through the second color filter; and
a third pixel configured to:
photoelectrically convert the light of the first color component with the first photoelectric conversion unit, and
photoelectrically convert light of a sixth color component with the second photoelectric conversion unit,
wherein the light of the sixth color component passes through the first photoelectric conversion unit; and
wherein the first color component and the sixth color component are mixed to generate white (W),
wherein:
the first color filter and the second color filter are below the first photoelectric conversion unit on a light incident side;
the first color component is green (G);
the second color component is red (R);
the third color component is red (R);
the fourth color component is blue (B);
the fifth color component is blue (B); and
the sixth color component is magenta (Mg).

2. The solid-state imaging device according to claim 1, wherein the pixel array unit comprises a plurality of 2×2 pixel matrices, and,
wherein, in each 2×2 pixel matrix of the plurality of 2×2 pixel matrices, the first pixel and the second pixel are diagonally positioned, and the third pixel is in the diagonal positions that are unoccupied by the first pixel and the second pixel.

3. The solid-state imaging device according to claim 1, wherein:
the photodiode is a buried photodiode; and
a pixel transistor is on a wiring layer side of the photodiode.

4. The solid-state imaging device according to claim 1, wherein
the third pixel is configured to detect phase difference,
the third pixel comprises a plurality of transparent electrodes,
each transparent electrode of the plurality of transparent electrodes is configured to extract a signal charge generated by the first photoelectric conversion unit.

5. The solid-state imaging device according to claim 1, wherein
a first semiconductor substrate having a sensor circuit comprises the first photoelectric conversion unit and the second photoelectric conversion unit,
a second semiconductor substrate comprises a logic circuit,
a third semiconductor substrate comprises a memory circuit, and
the first semiconductor substrate, the second semiconductor substrate, and the third semiconductor substrate are stacked in an order.

6. A solid-state imaging device comprising:
a pixel array unit including a plurality of pixels, wherein the plurality of pixels are in a two-dimensionally array in the pixel array unit,
wherein each pixel of the plurality of pixels comprises:
a first photoelectric conversion unit configured to generate a signal charge based on light absorbed of a first color component; and
a second photoelectric conversion unit configured to generate a signal charge that corresponds to an amount of incident light,
wherein the second photoelectric conversion unit comprises a photodiode, and
wherein the plurality of pixels comprise:
a first pixel configured to:
photoelectrically convert light of the first color component with the first photoelectric conversion unit, and
photoelectrically convert light of a third color component with the second photoelectric conversion unit,
wherein the light of the third color component passes through a first color filter and the first photoelectric conversion unit, and
wherein light of a second color component passes through the first color filter;
a second pixel configured to:
photoelectrically convert the light of the first color component with the first photoelectric conversion unit, and
photoelectrically convert light of a fifth color component with the second photoelectric conversion unit,
wherein the light of the fifth color component passes through a second color filter and the first photoelectric conversion unit,
wherein light of a fourth color component passes through the second color filter; and
a third pixel configured to:
photoelectrically convert the light of the first color component with the first photoelectric conversion unit, and
photoelectrically convert light of a sixth color component with the second photoelectric conversion unit,
wherein the light of the sixth color component passes through the first photoelectric conversion unit; and
wherein the first color component and the sixth color component are mixed to generate white (W),
wherein:
the first color filter and the second color filter are above the first photoelectric conversion unit on a light incident side;

the first color component is green (G);
the second color component is yellow (Ye);
the third color component is red (R);
the fourth color component is cyan (Cy);
the fifth color component is blue (B); and
the sixth color component is magenta (Mg).

7. The solid-state imaging device according to claim 6, wherein the pixel array unit comprises a plurality of 2×2 pixel matrices, and,
wherein, in each 2×2 pixel matrix of the plurality of 2×2 pixel matrices, the first pixel and the second pixel are diagonally positioned, and the third pixel is in the diagonal positions that are unoccupied by the first pixel and the second pixel.

8. The solid-state imaging device according to claim 6, wherein:
the photodiode is a buried photodiode; and
a pixel transistor is a wiring layer side of the photodiode.

9. The solid-state imaging device according to claim 6, wherein
the third pixel is configured to detect phase difference,
the third pixel comprises a plurality of transparent electrodes,
each transparent electrode of the plurality of transparent electrodes is configured to extract a signal charge generated by the first photoelectric conversion unit.

10. The solid-state imaging device according to claim 6, wherein
a first semiconductor substrate having a sensor circuit comprises the first photoelectric conversion unit and the second photoelectric conversion unit,
a second semiconductor substrate comprises a logic circuit,
a third semiconductor substrate comprises a memory circuit, and
the first semiconductor substrate, the second semiconductor substrate, and the third semiconductor substrate are stacked in an order.

11. An electronic apparatus comprising a solid-state imaging device that comprises:
a pixel array unit including a plurality of pixels, wherein the plurality of pixels are in a two-dimensionally array in the pixel array unit,
wherein each pixel of the plurality of pixels comprises:
a first photoelectric conversion unit configured to generate a signal charge based on light absorbed of a first color component; and
a second photoelectric conversion unit configured to generate a signal charge that corresponds to an amount of incident light,
wherein the second photoelectric conversion unit comprises a photodiode, and
wherein the plurality of pixels comprise:
a first pixel configured to:
photoelectrically convert the light of the first color component with the first photoelectric conversion unit, and
photoelectrically convert light of a third color component with the second photoelectric conversion unit,
wherein the light of the third color component passes through a first color filter and the first photoelectric conversion unit, and
wherein light of a second color component passes through the first color filter;
a second pixel configured to:
photoelectrically convert the light of the first color component with the first photoelectric conversion unit, and
photoelectrically convert light of a fifth color component with the second photoelectric conversion unit,
wherein the light of the fifth color component passes through a second color filter and the first photoelectric conversion unit,
wherein light of a fourth color component passes through the second color filter; and
a third pixel configured to:
photoelectrically convert the light of the first color component with the first photoelectric conversion unit, and
photoelectrically convert light of a sixth color component with the second photoelectric conversion unit,
wherein the light of the sixth color component passes through the first photoelectric conversion unit; and
wherein the first color component and the sixth color component are mixed to generate white (W),
wherein:
the first color filter and the second color filter are below the first photoelectric conversion unit on a light incident side;
the first color component is green (G);
the second color component is red (R);
the third color component is red (R);
the fourth color component is blue (B);
the fifth color component is blue (B); and
the sixth color component is magenta (Mg).

12. An electronic apparatus comprising a solid-state imaging device that comprises:
a pixel array unit including a plurality of pixels, wherein the plurality of pixels are in a two-dimensionally array in the pixel array unit,
wherein each pixel of the plurality of pixels comprises:
a first photoelectric conversion unit configured to generate a signal charge based on light absorbed of a first color component; and
a second photoelectric conversion unit configured to generate a signal charge that corresponds to an amount of incident light,
wherein the second photoelectric conversion unit comprises a photodiode, and
wherein the plurality of pixels comprise:
a first pixel configured to:
photoelectrically convert light of the first color component with the first photoelectric conversion unit, and
photoelectrically convert light of a third color component with the second photoelectric conversion unit,
wherein the light of the third color component passes through a first color filter and the first photoelectric conversion unit, and
wherein light of a second color component passes through the first color filter;
a second pixel configured to:
photoelectrically convert the light of the first color component with the first photoelectric conversion unit, and photoelectrically convert light of a fifth color component with the second photoelectric conversion unit,
 wherein the light of the fifth color component passes through a second color filter and the first photoelectric conversion unit, and
 wherein light of a fourth color component passes through the second color filter; and
a third pixel configured to:
 photoelectrically convert the light of the first color component with the first photoelectric conversion unit, and
 photoelectrically convert light of a sixth color component with the second photoelectric conversion unit,
 wherein the light of the sixth color component passes through the first photoelectric conversion unit; and
 wherein the first color component and the sixth color component are mixed to generate white (W),
 wherein:
  the first color filter and the second color filter are above the first photoelectric conversion unit on a light incident side;
  the first color component is green (G);
  the second color component is yellow (Ye);
  the third color component is red (R);
  the fourth color component is cyan (Cy);
  the fifth color component is blue (B); and
  the sixth color component is magenta (Mg).

* * * * *